(12) United States Patent
Heinikoski et al.

(10) Patent No.: US 7,796,959 B2
(45) Date of Patent: Sep. 14, 2010

(54) DATA PROCESSING METHOD, TRANSMITTER, DEVICE, NETWORK ELEMENT AND BASE STATION

(75) Inventors: Kauko Heinikoski, Oulu (FI); Samu Saarinen, Oulu (FI)

(73) Assignee: Nokia Siemens Networks Oy, Espoo (FI)

( * ) Notice: Subject to any disclaimer, the term of this patent is extended or adjusted under 35 U.S.C. 154(b) by 763 days.

(21) Appl. No.: 11/476,622

(22) Filed: Jun. 29, 2006

(65) Prior Publication Data

US 2007/0015474 A1 Jan. 18, 2007

(30) Foreign Application Priority Data

Jun. 29, 2005 (FI) .................................. 20055354

(51) Int. Cl.
*H04B 1/04* (2006.01)
(52) U.S. Cl. .................. 455/114.2; 455/114.3; 375/297
(58) Field of Classification Search ................ 455/126, 455/114.2, 114.3, 103, 117, 118, 324, 63.1, 455/115.1, 127.1, 108, 120, 124–125; 375/285, 375/296–297, 308, 269, 284; 330/149, 106–107, 330/136
See application file for complete search history.

(56) References Cited

U.S. PATENT DOCUMENTS

| 6,246,286 | B1 * | 6/2001 | Persson .................... 330/149 |
| 6,587,514 | B1 * | 7/2003 | Wright et al. ............... 375/296 |
| 6,593,812 | B2 * | 7/2003 | Sundstrom ................. 330/136 |
| 6,606,483 | B1 * | 8/2003 | Baker et al. ................. 455/126 |
| 6,741,663 | B1 * | 5/2004 | Tapio et al. ................. 375/297 |
| 6,836,517 | B2 * | 12/2004 | Nagatani et al. ............. 375/296 |
| 7,313,199 | B2 * | 12/2007 | Gupta et al. ................. 375/297 |
| 2001/0005402 | A1 * | 6/2001 | Nagatani et al. ............. 375/296 |
| 2002/0171484 | A1 * | 11/2002 | Sundstorm .................. 330/136 |
| 2003/0184372 | A1 * | 10/2003 | Fudaba et al. ............... 330/149 |
| 2003/0210093 | A1 * | 11/2003 | Zhang ........................ 330/149 |
| 2004/0017859 | A1 * | 1/2004 | Sills et al. ................... 375/296 |
| 2005/0153669 | A1 * | 7/2005 | Suzuki et al. ............... 455/103 |
| 2005/0163252 | A1 * | 7/2005 | McCallister et al. ........ 375/296 |
| 2005/0254595 | A1 * | 11/2005 | Song et al. .................. 375/297 |
| 2006/0062324 | A1 * | 3/2006 | Naito et al. ................. 375/296 |
| 2008/0095266 | A1 * | 4/2008 | Rashev et al. ............... 375/298 |

(Continued)

FOREIGN PATENT DOCUMENTS

EP 1 249 931 A2 10/2002

(Continued)

*Primary Examiner*—Pablo N Tran
(74) *Attorney, Agent, or Firm*—Squire, Sanders & Dempsey L.L.P

(57) ABSTRACT

The invention is related to a device comprising: generating unit configured to generate a feedback signal; setting unit configured to set a predetermined frequency shift to the feedback signal; evaluating unit configured to evaluate distortion caused in a transmission chain on the basis of the frequency shifted feedback signal; adapting unit configured to adapt quadrature modulation pre-distortion algorithms of the transmission chain; wherein the setting unit is further configured to set the frequency of the feedback signal to an original frequency value; wherein the evaluating unit is further configured to evaluate distortion caused in the feedback chain based on the feedback signal having the original frequency; wherein the adapting unit is further configured to adapt quadrature demodulation pre-distortion algorithms of the feedback chain; and wherein the adapting unit is further configured to adapt other pre-distortion algorithms.

22 Claims, 2 Drawing Sheets

U.S. PATENT DOCUMENTS

2008/0139141 A1* 6/2008 Varghese et al. ......... 455/114.3
2008/0171522 A1* 7/2008 Ben-Ayun et al. ........... 455/126
2008/0233904 A1* 9/2008 Suzuki et al. ............... 455/126
2009/0213972 A1* 8/2009 Maunuksela et al. ........ 375/371
2009/0264074 A1* 10/2009 Darabi et al. .............. 455/41.2

FOREIGN PATENT DOCUMENTS

EP 1 437 826 A1 7/2004
WO WO 2004/098045 A1 11/2004

* cited by examiner

DATA PROCESSING METHOD, TRANSMITTER, DEVICE, NETWORK ELEMENT AND BASE STATION

FIELD

The invention relates to a data processing method, a transmitter, a device, a network element and a base station.

BACKGROUND

Due to non-linear effects of analog components of a transmission chain, a transmitted signal is distorted in amplitude and phase. Such distortions usually depend on the signal magnitude.

The main cause for the distortions is a power amplifier of a transmitter. In addition to amplifying a desired signal, the power amplifier generates higher order harmonics of the original signal spectrum. The spread of the signal spectrum causes two major effects: a radio frequency spectrum mask does not fulfil the requirements for out-of-band radiated power, and detection of a distorted signal in a receiver suffers from errors.

The spread of the signal spectrum can be avoided (or at least diminished) by reducing the power of a power amplifier input signal. This is called "backing off". However, such "backing off" leads to inefficient use of the amplification stage. Another option is to use a linearization technique. Several different prior art linearization techniques exist. The most effective of them are adaptive, since a plurality of factors, such as temperature, affect a transmission chain, making it unstable. Adaptation requires a reliable estimate of signal distortion. For the estimation, a feedback chain is typically used. A problem is that the feedback chain also generates distortion which sometimes makes the estimate of the signal distortion quite unreliable.

BRIEF DESCRIPTION OF THE INVENTION

According to an aspect of the invention, there is provided a data processing method in a transmitter, the method comprising: generating a feedback signal by using a feedback chain; setting a predetermined frequency shift to the feedback signal; evaluating distortion caused in a transmission chain based on the frequency shifted feedback signal; adapting quadrature modulation pre-distortion algorithms of the transmission chain; setting frequency of the feedback signal to an original frequency; evaluating distortion caused in the feedback chain based on the feedback signal having the original frequency; adapting quadrature demodulation pre-distortion algorithms of the feedback chain; adapting other pre-distortion algorithms.

According to another aspect of the invention, there is provided a data processing method in a transmitter, the method comprising: generating a feedback signal by using a feedback chain; setting a predetermined frequency shift to the feedback signal; evaluating distortion caused in a transmission chain based on the frequency shifted feedback signal; adapting pre-distortion algorithms of the transmission chain; setting frequency of the feedback signal to an original frequency; evaluating distortion caused in the feedback chain based on the feedback signal having the original frequency; and adapting pre-distortion algorithms of the feedback chain.

According to another aspect of the invention, there is provided a transmitter, comprising: generating unit configured to generate a feedback signal; setting unit configured to set a predetermined frequency shift to the feedback signal; evaluating unit configured to evaluate distortion caused in a transmission chain based on the frequency shifted feedback signal; adapting unit configured to adapt quadrature modulation pre-distortion algorithms of the transmission chain; wherein the setting unit is further configured to set frequency of the feedback signal to an original frequency; wherein evaluating the evaluating unit is further configured to evaluate distortion caused in the feedback chain based on the feedback signal having the original frequency; wherein the adapting unit is further configured to adapt quadrature demodulation pre-distortion algorithms of the feedback chain; and wherein the adapting unit is further configured to adapt other pre-distortion algorithms.

According to another aspect of the invention, there is provided a device, comprising: generating unit configured to generate a feedback signal; setting unit configured to set a predetermined frequency shift to the feedback signal; evaluating unit configured to evaluate distortion caused in a transmission chain based on the frequency shifted feedback signal; adapting unit configured to adapt quadrature modulation pre-distortion algorithms of the transmission chain; wherein the setting unit is further configured to set frequency of the feedback signal to an original frequency; wherein the evaluating unit is further configured to evaluate distortion caused in the feedback chain based on the feedback signal having the original frequency; wherein the adapting unit is further configured to adapt quadrature demodulation pre-distortion algorithms of the feedback chain; and wherein the adapting unit is further configured to adapt other pre-distortion algorithms.

According to another aspect of the invention, there is provided a network element, comprising: generating unit configured to generate a feedback signal; setting unit configured to set a predetermined frequency shift to the feedback signal; evaluating unit configured to evaluate distortion caused in a transmission chain based on the frequency shifted feedback signal; adapting unit configured to adapt quadrature modulation pre-distortion algorithms of the transmission chain; wherein the setting unit is further configured to set a frequency of the feedback signal to an original frequency wherein the evaluating unit is further configured to evaluate distortion caused in the feedback chain based on the basis of the feedback signal having the original frequency; wherein the adapting unit is further configured to adapt quadrature demodulation pre-distortion algorithms of the feedback chain; and wherein the adapting unit is further configured to adapt other pre-distortion algorithms.

According to another aspect of the invention, there is provided a base station comprising: generating unit configured to generate a feedback signal; setting unit configured to set a predetermined frequency shift to the feedback signal; evaluating unit configured to evaluate distortion caused in a transmission chain based on the frequency shifted feedback signal; adapting unit configured to adapt quadrature modulation pre-distortion algorithms of the transmission chain; wherein the setting unit is further configured to set a frequency of the feedback signal to an original frequency; wherein the evaluating unit is further configured to evaluate distortion caused in the feedback chain based on of the feedback signal having the original frequency; wherein the adapting unit is further configured to adapt quadrature demodulation pre-distortion algorithms of the feedback chain; and wherein the adapting unit is further configured to adapt other pre-distortion algorithms.

According to another aspect of the invention, there is provided a transmitter configured to: generate a feedback signal; set a predetermined frequency shift to the feedback signal; evaluate distortion caused in a transmission chain based on the frequency shifted feedback signal; adapt quadrature modulation pre-distortion algorithms of the transmission chain; set frequency of the feedback signal to an original frequency value; evaluate distortion caused in the feedback chain based on the feedback signal having the original frequency; adapt quadrature demodulation pre-distortion algorithms of the feedback chain; and adapt other pre-distortion algorithms.

According to another aspect of the invention, there is provided a device configured to: generate a feedback signal; set a predetermined frequency shift to the feedback signal; evaluate distortion caused in a transmission chain based on the frequency shifted feedback signal; adapt quadrature modulation pre-distortion algorithms of the transmission chain; set frequency of the feedback signal to an original frequency; evaluate distortion caused in the feedback chain based on the feedback signal having the original frequency; adapt quadrature demodulation pre-distortion algorithms of the feedback chain; and adapt other pre-distortion algorithms.

According to another aspect of the invention, there is provided a network element configured to: generate a feedback signal; set a predetermined frequency shift to the feedback signal; evaluate distortion caused in a transmission chain based on the frequency shifted feedback signal; adapt quadrature modulation pre-distortion algorithms of the transmission chain; set frequency of the feedback signal to an original frequency; evaluate distortion caused in the feedback chain based on the feedback signal having the original frequency; adapt quadrature demodulation pre-distortion algorithms of the feedback chain; and adapt other pre-distortion algorithms.

According to another aspect of the invention, there is provided a base station configured to: generate a feedback signal; set a predetermined frequency shift to the feedback signal; evaluate distortion caused in a transmission chain based on the frequency shifted feedback signal; adapt quadrature modulation pre-distortion algorithms of the transmission chain; set frequency of the feedback signal to an original frequency; evaluate distortion caused in the feedback chain based on the feedback signal having the original frequency; adapt quadrature demodulation pre-distortion algorithms of the feedback chain; and adapt other pre-distortion algorithms.

The invention provides several advantages.

In an embodiment of the invention, errors caused by the transmission chain can be separated from errors caused by the feedback chain, thus providing a reliable estimate of the signal distortion for pre-distortion.

LIST OF DRAWINGS

In the following, the invention will be described in greater detail with reference to embodiments and the accompanying drawings, in which FIG. 1 shows an example of a communication system;

DESCRIPTION OF EMBODIMENTS

Figure 1:
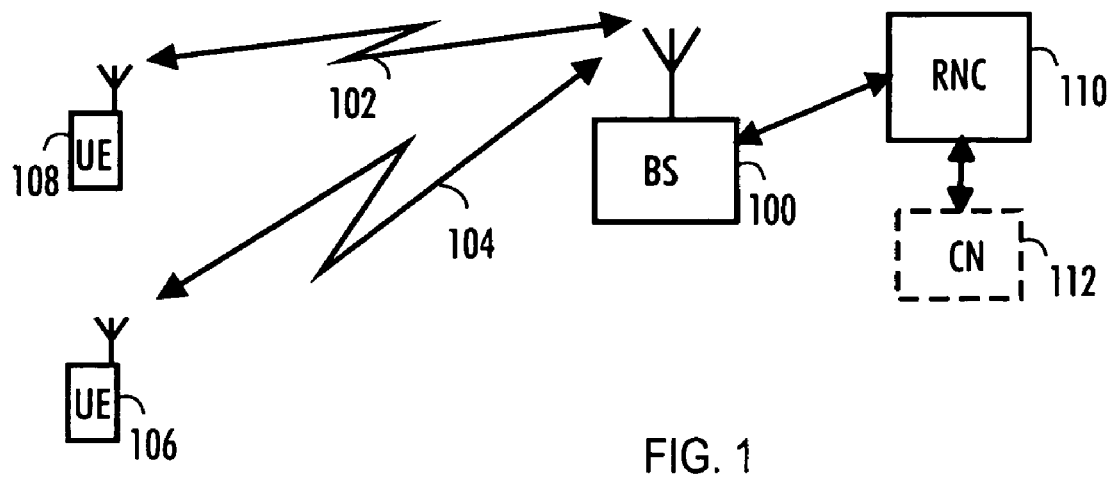

With reference to FIG. 1, we examine an example of a communication system to which embodiments of the invention can be applied. The present invention can be applied to various communication systems. One example of such a communication system is a Universal Mobile Telecommunications System (UMTS) radio access network. It is a radio access network which includes wideband code division multiple access (WCDMA) technology and can also offer real-time circuit and packet switched services. Another example is a Global System for Mobile Communications (GSM). The embodiments are not, however, restricted to the systems given as examples but a person skilled in the art may apply the solution to other communication systems provided with the necessary properties.

It is clear to a person skilled in the art that the method according to the invention can be applied to systems utilizing different air interface standards or modulation methods, such as quadrature phase-shift keying (QPSK) or orthogonal frequency division multiplexing (OFDM).

FIG. 1 is a simplified illustration of a data transmission system to which the solution according to the invention is applicable. This is a part of a cellular radio system, which comprises a base station (or node B) 100, which has bi-directional radio links 102 and 104 to subscriber terminals 106 and 108. The subscriber terminals may be fixed, vehicle-mounted or portable. The base station includes transceivers, for instance. From the transceivers of the base station, there is a connection to an antenna unit that establishes the bi-directional radio links to the subscriber terminals. The base station is further connected to a controller 110, a radio network controller (RNC) or a base station controller (BSC), which transmits the connections of the terminals to the other parts of the network. The base station controller of the radio network controller controls in a centralized manner several base stations connected to it. The base station controller or the radio network controller is further connected to a core network 112 (CN). Depending on the system, the counterpart on the CN side can be a mobile services switching centre (MSC), a media gateway (MGW) or a serving GPRS (general packet radio service) support node (SGSN) etc.

The radio system can also communicate with other networks, such as a public switched telephone network or the Internet.

Figure 2:
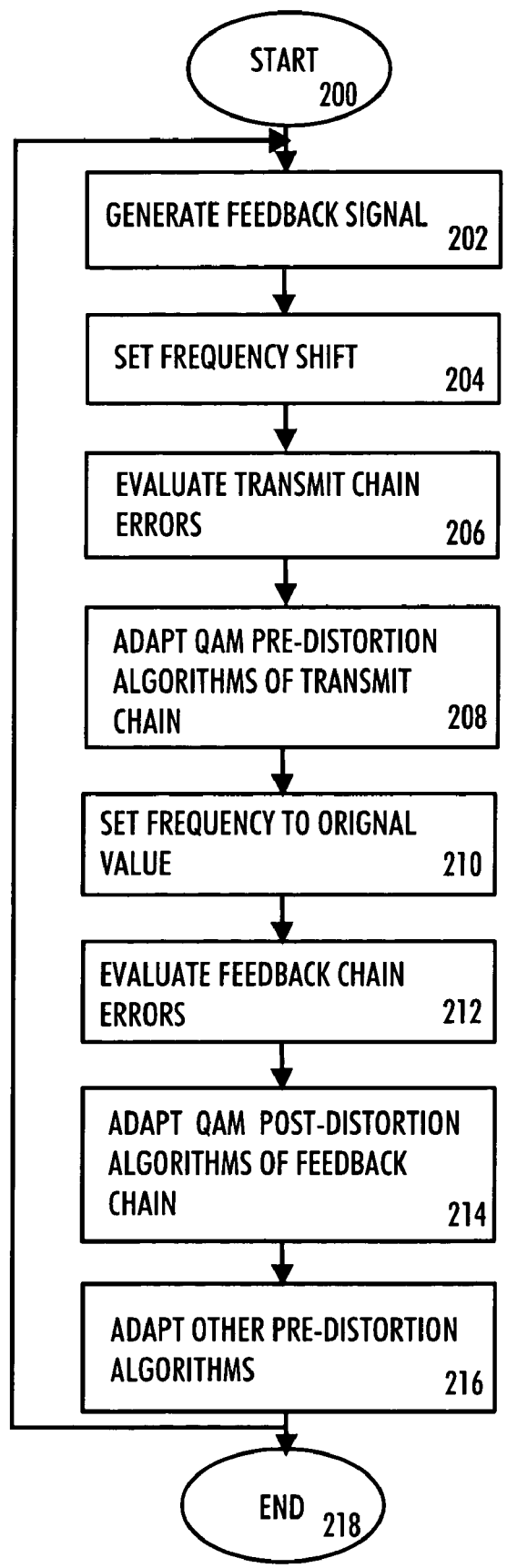
FIG. 2 is a flow chart.

Next, an embodiment of the data processing method is explained in further detail by means of FIG. 2. In the embodiment, the feedback chain depicted in FIG. 3 may be used.

First, the principle of pre-distortion is clarified.

The main cause for distortions is non-linearity of a power amplifier. Power amplifiers are required in radio systems to amplify signals before transmission, because radio signals attenuate on the radio path. Unfortunately, high-power radio-frequency amplifiers tend to be non-linear devices and therefore they often cause distortion. This distortion is expressed, for example, as Inter-Symbol-Interference or out-off-band power in adjacent frequency bands. An ACLR (Adjacent Carrier Leakage Ratio) quantifies the out-off-band transmitted power and thus it must remain within specified limits.

Linear amplification is mostly needed when the transmitted signal contains both amplitude and phase modulation. Examples of these modulation methods include quadrature phase-shift keying (QPSK) and orthogonal frequency division multiplexing (OFDM).

Pre-distortion generates a non-linear transfer function which can be thought of as a reverse of the power amplifier's transfer function taking into account both amplitude and phase. In other words, pre-distortion is designed to provide distortion complementary to that of the power amplifier, prior to the input of the power amplifier, producing an overall linear transfer function.

Effective pre-distortion requires adaptation since changes in parameters, such as in signal phase, modulation, component characteristics or temperature, change the transfer function of the power amplifier. For the adaptation, feedback from the power amplifier's output signal is required. The feedback is usually generated by using a feedback chain to produce measurement results from the power amplifier's output signal.

Various techniques are used for producing information on the power amplifier's output signal characteristics for pre-distortion adaptation purposes. Examples of such techniques include carrier-to-inter-modulation (C/I) ratio, which compares the amplitude of the desired output carries-to-inter-modulation -distortion (IMD) products; an adjacent channel power ratio (ACPR), which compares the power in an adjacent channel to that of the selected signal, a residual error signal, which relates to the complex error between transmit and feedback signals; and an error vector magnitude (EVM), which measures the deviation of the signal from the ideal waveform.

In the case of digital pre-distortion, complementary non-linearity is generated in the digital domain, typically at base-band or intermediate frequency. Therefore, it can be implemented in connection with digital signal processing (DSP) thus also providing a possibility to incorporate compensation for distortions caused by digital-to-analog conversion and frequency up-conversion.

A transmission chain modulator and a feedback chain demodulator generate similar kind of errors. Examples of modulator and demodulator errors include gain and phase imbalances manifesting themselves as an image frequency component of the desired signal. Another example is a DC-offset (direct current offset) which can be seen as a local oscillator component in transmitted and feedback signals.

The embodiment of the data processing method enables distortion caused by a transmitter modulator and distortion caused by a feedback demodulator to be separated, thus providing a possibility for more optimal adaptation of pre-distortion algorithms.

Figure 3:
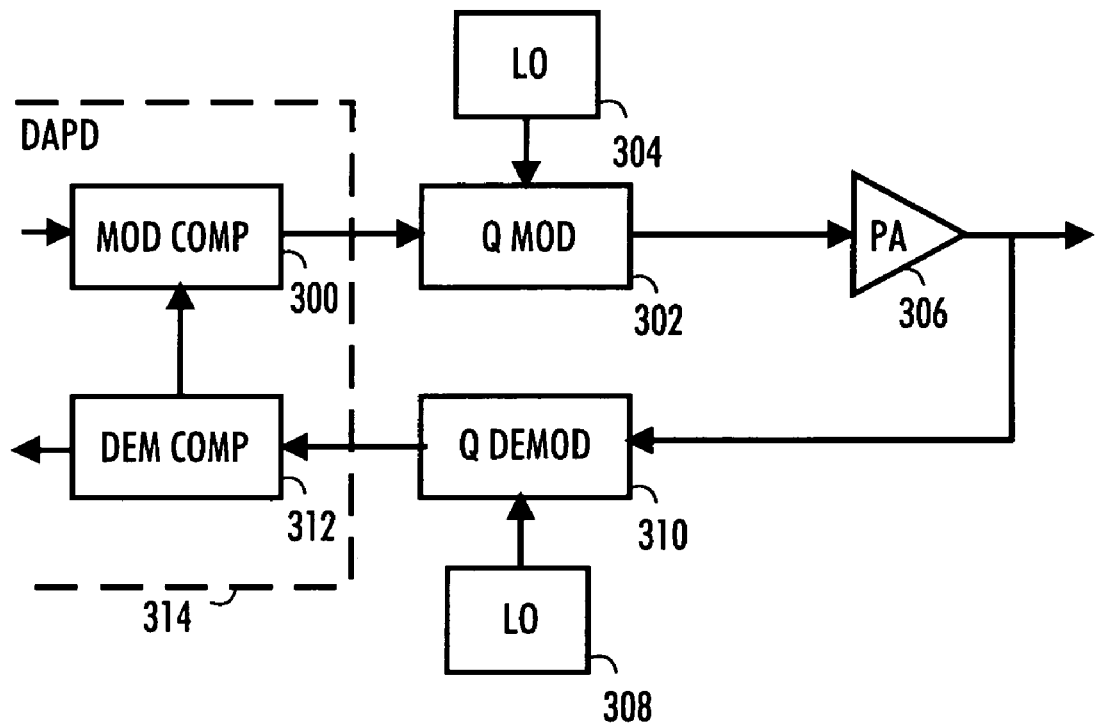
FIG. 3 illustrates a part of a transmitter including a feedback chain.

The embodiment begins in block 200. In block 202, a feedback signal is generated by using a feedback chain. A part of the output signal of the power amplifier is taken into the feedback chain for generating a feedback signal. One example of a feedback chain is depicted in FIG. 3 and will be explained later in this application.

In block 204, a predetermined frequency shift is set to the feedback signal. The frequency shift is usually generated by using a local oscillator. The purpose of the frequency shift is to separate transmitter modulator errors and feedback demodulator errors by generating a frequency offset. The amount of frequency separation needed may vary according to the circumstances. A suitable frequency shift can be found for instance by simulations.

In block 206, distortion caused in a transmission chain is evaluated on the basis of the frequency shifted feedback signal. The evaluation is typically based on measuring the feedback signal; the signal is usually measured after it has been returned from analog to digital form in a base-band frequency. It is also possible to measure a signal in another part of the feedback chain, for instance at an intermediate frequency.

Various techniques are used for producing measurement-based information on the distortion in the power amplifier's output signal characteristics. Examples of such techniques include a carrier-to-inter-modulation (C/I) ratio, which compares the amplitude of the desired output carries to inter-modulation-distortion (IMD) products; an adjacent channel power ratio (ACPR), which compares the power in an adjacent channel to that of the selected signal, a residual error signal, which relates to the complex error between transmit and feedback signals; and an error vector magnitude (EVM), which measures the deviation of the signal from the ideal waveform.

Attention should be paid to the fact that the frequency shift (or the frequency offset) between the transmission chain and the down-conversion chain is removed with digital down-conversion in order to enable a transmitted signal and a frequency shifted feedback signal to be compared at the same frequency.

In block 208, quadrature modulation (AQM) pre-distortion algorithms of the transmission chain are adapted. Several different prior art pre-distortion algorithms exist but they are not explained here in further detail. Basically, pre-distortion algorithms are designed to adapt one or more signal properties affected by transmission chain distortions, such as amplitude and phase.

In block 210, the frequency of the feedback signal is set to an original frequency value. The frequency is usually returned to the original frequency by using the same local oscillator as was used for generating. A digital down-conversion frequency shift is also removed.

In block 212, distortion caused in the feedback chain is evaluated on the basis of the feedback signal having the original frequency. The evaluation is typically based on measuring the feedback signal as described in connection with block 206. The signal is usually measured after it has been returned from analog to digital form in a base-band frequency. It is also possible to measure a signal in another part of the feedback chain, for instance at an intermediate frequency.

Various techniques are used for producing measurement-based information on the distortion in the power amplifier's output signal characteristics. Examples of such techniques include a carrier-to-inter-modulation (C/I) ratio, which compares the amplitude of the desired output carries to inter-modulation-distortion (IMD) products; an adjacent channel power ratio (ACPR), which compares the power in an adjacent channel to that of the selected signal, a residual error signal, which relates to the complex error between transmit and feedback signals; and an error vector magnitude (EVM), which measures the deviation of the signal from the ideal waveform.

In block 214, quadrature demodulation (AQDeM) post-distortion algorithms of the feedback chain are adapted. Several different prior art pre-distortion algorithms exist but they are not explained here in further detail. Basically, pre-distortion algorithms are designed to adapt one or more signal properties affected by transmission chain distortions, such as amplitude and phase.

In block 216, other pre-distortion algorithms are adapted. Examples of potential characteristics to be adjusted by the pre-distortion algorithms include time and frequency.

It is also possible to adapt pre-distortion algorithms compensating for transmitter modulator distortion by simultaneously taking into account distortion caused in the feedback chain instead of using separate pre-distortion phases for the transmission chain and for the feedback chain.

The embodiment ends in block 218. Arrow 220 depicts that the embodiment is repeatable. The embodiment is typically repeated several times during transmission, using a predetermined measuring period.

In another embodiment, pre-distortion algorithms of the transmission chain are first adapted and pre-distortion algorithms of the feedback chain then are adapted. This embodiment is suitable for use with modulation methods other than quadrature amplitude modulation.

Next, an example of a part of a transmitter including a feedback chain is explained in greater detail by means of FIG.

3. A transmitter is typically located in a network element such as a base station or a communication device without being restricted thereto. It is obvious to a person skilled in the art that the structure of the transmitter may vary according to the implementation. The part of a transmitter of FIG. 3 can also be thought to be a separate device placeable for instance in a transmitter.

In this example, the transmitter includes a digital adaptive pre-distortion (DAPD) block 314.

A non-linear high-efficiency amplifier distorts both the amplitude and phase of a signal. Non-linearity also causes inter-modulation distortion and spectral re-growth. These cause adjacent channel interference due to which network performance deteriorates.

In principle, pre-distortion is designed to provide distortion complementary to that of the power amplifier, prior to the input of the power amplifier, producing an overall linear transfer function.

In the case of digital pre-distortion, the complementary non-linearity is generated in the digital domain, typically at base-band or intermediate frequency. Therefore it can be implemented in connection with digital signal processing (DSP) thus also providing a possibility to incorporate compensation for other distortion, such as distortion caused by digital-to-analog conversion and frequency up-conversion.

In DSP (Digital Signal Processing), the signal to be transmitted is processed in several ways, for instance it is encrypted and/or coded. The DSP may also include modulation and spreading, if the system is using a wide-band technique.

Digital adaptive pre-distortion is typically implemented by using a digital signal processing (DSP) device, typically a processor. The DSP device forms and updates the selected pre-distortion characteristics. Digital adaptive pre-distortion is typically implemented by using one or more look-up tables (LUT).

In a transmission chain, in quadrature amplitude modulation block 302, a signal is modulated directly to a carrier frequency (in other words to a radio frequency) either via an intermediate frequency or directly to the carrier frequency by using a local oscillator signal from a local oscillator 304.

Modulation means that a data stream modulates a carrier. In the example, a transmitter producing quadrature amplitude modulation (QAM) is depicted. QAM is a modulation technique that uses two amplitude modulated RF carriers that are out of phase by 90 degrees. Information transfer is achieved by accomplishing both phase and amplitude changes into the carriers.

Modulation methods are known in the art and therefore they are not explained here in greater detail.

Block 306 is a power amplifier which amplifies the signal for a radio path. High power amplifiers having high efficiency especially when used in systems using spectrally efficient modulation schemes, such as QPSK and OFDM, cause signal distortion. An amplifier may also be an amplifier chain including cascaded gain stages with different power gains.

The feedback chain includes a quadrature amplitude demodulation block 310 and a local oscillator 308. The local oscillator 308 changes the frequency of the feedback signal by producing frequency offset offering a possibility to separate transmitter modulator errors and feedback demodulator errors.

In block 310, the feedback signal is demodulated directly from a radio frequency to a digital base-band or an intermediate frequency. In the embodiment, block 310 also includes means for measuring the feedback signal.

In the embodiment, transmitter modulator compensator block 300 and feedback demodulator compensator block 312 are located in DAPD 314.

The transmitter modulator compensator evaluates distortion caused in the transmission chain on the basis of the frequency shifted feedback signal.

The evaluation is typically based on measuring the feedback signal. Various techniques are used for producing measurement-based information on the distortion in the power amplifier's output signal characteristics. Examples of such techniques include a carrier-to-inter-modulation (C/I) ratio, which compares the amplitude of the desired output carries to inter-modulation-distortion (IMD) products; an adjacent channel power ratio (ACPR), which compares the power in an adjacent channel to that of the selected signal, a residual error signal, which relates to the complex error between transmit and feedback signals; and an error vector magnitude (EVM), which measures the deviation of the signal from the ideal waveform.

The digital adaptive pre-distorter (DAPD) coupled with a modulator compensator 300 and a demodulator 312 compensator also adapts other required pre-distortion algorithms of the transmission chain. Several different prior art pre-distortion algorithms exist but they are not explained here in further detail. Basically, pre-distortion algorithms are designed to adapt one or more signal properties affected by transmission chain distortions, such as amplitude, phase and frequency.

The feedback demodulator compensator evaluates distortion caused in the feedback chain on the basis of the feedback signal having the original (typically base-band) frequency. The evaluation is typically based on measuring the feedback signal. Various techniques are used for producing measurement-based information on the distortion in the power amplifier's output signal characteristics. Examples of such techniques include a carrier-to-inter-modulation (C/I) ratio, which compares the amplitude of the desired output carries to inter-modulation-distortion (IMD) products; an adjacent channel power ratio (ACPR), which compares the power in an adjacent channel to that of the selected signal, a residual error signal, which relates to the complex error between transmit and feedback signals; and an error vector magnitude (EVM), which measures the deviation of the signal from the ideal waveform.

The feedback demodulator compensator also adapts required pre-distortion algorithms of the feedback chain. Several different prior art pre-distortion algorithms exist but they are not explained here in further detail. Basically, pre-distortion algorithms are designed to adapt one or more signal properties affect by transmission chain distortions, such as amplitude, phase and frequency.

Attention should be paid to the fact that the frequency shift (or the frequency offset) between the transmission chain and the local oscillator is removed with digital down-conversion in order to enable a transmitted signal (power amplifier's output signal) and a frequency shifted feedback signal to be compared at the same frequency. This is carried out either in the transmitter modulator compensator block or in the feedback demodulator compensator block in the DAPD.

It is also possible to adapt pre-distortion algorithms compensating for transmitter modulator distortion by simultaneously taking into account distortion caused in the feedback chain instead of using separate pre-distortion phases for the transmission chain and for the feedback chain.

The disclosed functionalities of the described embodiments of the data processing method can be advantageously implemented by means of software, typically being located in a Digital Signal Processor. The feedback information is provided with a feedback chain. The implementation solution can also be, for instance, an ASIC (Application Specific Integrated Circuit) component. A hybrid of these different implementations is also feasible.

Even though the invention has been described above with reference to an example according to the accompanying drawings, it is clear that the invention is not restricted thereto but it can be modified in several ways within the scope of the appended claims.

The invention claimed is:

1. A method, comprising:
generating a feedback signal by using a feedback chain;
setting a predetermined frequency shift to the feedback signal;
evaluating distortion caused in a transmission chain based on the frequency shifted feedback signal;
adapting quadrature modulation pre-distortion algorithms of the transmission chain;
setting frequency of the feedback signal to an original frequency;
evaluating distortion caused in the feedback chain based on the feedback signal having the original frequency;
adapting quadrature demodulation pre-distortion algorithms of the feedback chain; and
adapting pre-distortion algorithms configured to adjust at least one characteristic of the feedback signal.

2. The method of claim 1, further comprising generating the frequency shift by using a local oscillator.

3. The method of claim 1, wherein the evaluations are based on measuring the feedback signal.

4. The method of claim 1, further comprising removing the frequency shift with digital down-conversion in order to enable a transmitted signal and a frequency shifted feedback signal to be compared at an identical frequency.

5. The method of claim 1, further comprising carrying out the evaluations and the adaptations in a digital adaptive pre-distortion (DAPD) block.

6. The method of claim 1, further comprising:
setting the frequency of the feedback signal to an original frequency value; and
removing a digital down-conversion frequency shift.

7. A method, comprising:
generating a feedback signal by using a feedback chain;
setting a predetermined frequency shift to the feedback signal;
evaluating distortion caused in a transmission chain based on the frequency shifted feedback signal;
adapting pre-distortion algorithms of the transmission chain;
setting frequency of the feedback signal to an original frequency;
evaluating distortion caused in the feedback chain based on the feedback signal having the original frequency; and
adapting pre-distortion algorithms of the feedback chain.

8. An apparatus, comprising:
a generating unit configured to generate a feedback signal;
a setting unit configured to set a predetermined frequency shift to the feedback signal;
an evaluating unit configured to evaluate distortion caused in a transmission chain based on the frequency shifted feedback signal; and
an adapting unit configured to adapt quadrature modulation pre-distortion algorithms of the transmission chain,
wherein said setting unit is further configured to set a frequency of the feedback signal to an original frequency,
wherein said evaluating unit is further configured to evaluate distortion caused in the feedback chain based on the feedback signal having the original frequency,
wherein said adapting unit is further configured to adapt quadrature demodulation pre-distortion algorithms of the feedback chain, and
wherein said adapting unit is further configured to adapt pre-distortion algorithms configured to adjust at least one characteristic of the feedback signal.

9. The apparatus of claim 8, wherein said generating unit is further configured to generate a frequency shift.

10. The apparatus of claim 8, further comprising a measuring unit configured to measure the feedback signal for evaluation.

11. The apparatus of claim 8, further comprising a removing unit configured to remove frequency shift with digital down-conversion in order to enable a transmitted signal and a frequency shifted feedback signal to be compared at an identical frequency.

12. The apparatus of claim 8, wherein the evaluations and the adaptations are carried out in a digital adaptive pre-distortion (DAPD) block.

13. The apparatus of claim 8, wherein the setting unit is further configured to remove a digital down-conversion frequency shift.

14. An apparatus, comprising:
a generating unit configured to generate a feedback signal;
a setting unit configured to set a predetermined frequency shift to the feedback signal;
an evaluating unit configured to evaluate distortion caused in a transmission chain based on the frequency shifted feedback signal; and
an adapting unit configured to adapt quadrature modulation pre-distortion algorithms of the transmission chain,
wherein said setting unit is further configured to set a frequency of the feedback signal to an original frequency,
wherein said evaluating unit is further configured to evaluate distortion caused in the feedback chain based on the feedback signal having the original frequency,
wherein said adapting unit is further configured to adapt quadrature demodulation pre-distortion algorithms of the feedback chain, and
wherein said adapting unit is further configured to adapt pre-distortion algorithms configured to adjust at least one characteristic of the feedback signal.

15. An apparatus, comprising:
a generating unit configured to generate a feedback signal;
a setting unit configured to set a predetermined frequency shift to the feedback signal;
an evaluating unit configured to evaluate distortion caused in a transmission chain based on the frequency shifted feedback signal; and
an adapting unit configured to adapt quadrature modulation pre-distortion algorithms of the transmission chain,
wherein said setting unit is further configured to set a frequency of the feedback signal to an original frequency,
wherein said evaluating unit is further configured to evaluate distortion caused in the feedback chain based on the feedback signal having the original frequency,
wherein said adapting unit is further configured to adapt quadrature demodulation pre-distortion algorithms of the feedback chain, and
wherein said adapting unit is further configured to adapt pre-distortion algorithms configured to adjust at least one characteristic of the feedback signal.

16. The apparatus of claim 15, wherein said generating unit is further configured to generate a frequency shift.

17. The apparatus of claim 15, further comprising a measuring unit configured to measure the feedback signal for evaluation.

18. The apparatus of claim 15, further comprising a removing unit configured to remove the frequency shift with digital down-conversion in order to enable a transmitted signal and a frequency shifted feedback signal to be compared at an identical frequency.

19. The apparatus of claim 15, wherein the evaluations and the adaptations are carried out in a digital adaptive pre-distortion (DAPD) block.

20. The apparatus of claim 15, wherein the setting unit is further configured to remove a digital down-conversion frequency shift.

21. An apparatus, comprising:
a generating unit configured to generate a feedback signal;
a setting unit configured to set a predetermined frequency shift to the feedback signal;
an evaluating unit configured to evaluate distortion caused in a transmission chain based on the frequency shifted feedback signal; and
an adapting unit configured to adapt quadrature modulation pre-distortion algorithms of the transmission chain,
wherein said setting unit is further configured to set frequency of the feedback signal to an original frequency,
wherein said evaluating unit is further configured to evaluate distortion caused in the feedback chain based on the feedback signal having the original frequency,
wherein said adapting unit is further configured to adapt quadrature demodulation pre-distortion algorithms of the feedback chain, and
wherein said adapting unit is further configured to adapt pre-distortion algorithms configured to adjust at least one characteristic of the feedback signal.

22. An apparatus, comprising:
a processor configured to
generate a feedback signal,
set a predetermined frequency shift to the feedback signal,
evaluate distortion caused in a transmission chain based on the frequency shifted feedback signal,
adapt quadrature modulation pre-distortion algorithms of the transmission chain,
set frequency of the feedback signal to an original frequency,
evaluate distortion caused in the feedback chain based on the feedback signal having the original frequency,
adapt quadrature demodulation pre-distortion algorithms of the feedback chain, and
adapt pre-distortion algorithms configured to adjust at least one characteristic of the feedback signal.

\* \* \* \* \*